United States Patent [19]
Fujita

[11] Patent Number: 5,847,610
[45] Date of Patent: Dec. 8, 1998

[54] PROTECTION CIRCUIT FOR AN AUDIO AMPLIFIER

[75] Inventor: Shinichi Fujita, Hamamatsu, Japan

[73] Assignee: Yamaha Corporation, Hamamatsu, Japan

[21] Appl. No.: 760,026

[22] Filed: Dec. 4, 1996

[30] Foreign Application Priority Data

Dec. 5, 1995 [JP] Japan ................................. 7-344452

[51] Int. Cl.$^6$ ...................................................... H03F 1/52
[52] U.S. Cl. ...................... 330/298; 330/207 P; 381/55; 381/120
[58] Field of Search ................................... 330/202, 297, 330/298, 207 P; 361/79, 88; 381/55, 120, 121

[56] References Cited

U.S. PATENT DOCUMENTS 4,000,475 12/1976 Oiwa ........................................ 330/66
4,173,740 11/1979 Nagata et al. .
5,543,760 8/1996 Honda et al. ........................... 330/298

FOREIGN PATENT DOCUMENTS 3429701 2/1986 Germany .
6260849 9/1994 Japan .

*Primary Examiner*—James B. Mullins
*Attorney, Agent, or Firm*—Loeb & Loeb LLP

[57] ABSTRACT

In a protection circuit for an audio amplifier, a power relay is provided on a primary side of a power source of the audio amplifier. When a power switch has instructed power-on, a drive power is supplied from an auxiliary power source to the power relay by an instruction given by a control section which is supplied with an operating power thereby to turn on the power relay. A primary voltage is thereby supplied to the power source to set the audio amplifier to a power-on state. When the audio amplifier is in the power-on state, an excess current flowing in an output stage of a power amplifier and dc voltage occurring in an output signal line of the power amplifier and, if necessary, an abnormal voltage occurring in the power source are detected and the power relay is cut off by an instruction from the control section when either one of the abnormalities takes place whereby a primary side of the power source is accurately cut off when an abnormality has occurred. According to the invention, since the primary side of the power source is accurately cut off when abnormality has occurred, damage to circuit elements and loudspeakers can be prevented even when abnormality has occurred in the power source.

11 Claims, 7 Drawing Sheets

PROTECTION CIRCUIT FOR AN AUDIO AMPLIFIER

BACKGROUND OF THE INVENTION

This invention relates to a protection circuit for an amplifier used in an audio device (hereinafter referred to as "audio amplifier") and, more particularly, to such circuit capable of accurately protecting circuit elements and loudspeakers against occurrence of an excess current in an output stage of a power amplifier and occurrence of dc voltage in an output line of a power amplifier.

In a case where loudspeaker terminals are erroneously short-circuited in an audio amplifier, an excess current tends to flow in an output stage of a power amplifier resulting in damage to an output transistor. Also, in a case where dc voltage occurs in an output signal line of a power amplifier due to malfunction of a circuit element, burning of a loudspeaker results. A protection circuit therefore is provided to overcome such inconvenience occurring in an audio amplifier. In conventional protection circuits, occurrence of an excess current or dc voltage (i.e., variation in potential in an intermediate portion) is detected and thereupon a power line on the secondary side of a power source is cut off or an output signal line of a power amplifier is cut off.

If occurrence of an abnormal current (excess current) in an output stage of a power amplifier or dc voltage in an output signal line of a power amplifier is caused by abnormality in a power source, there will be a case where it is insufficient to cut off a power line on the secondary side of the power source or cut off an output line to a loudspeaker (such, for example, as a case where source voltage for a pre-amplifier is simultaneously raised excessively to such a degree that the pre-amplifier will be damaged if such high voltage is maintained). In such cases, it will be necessary to cut off a primary side of the power source. There is an audio device in which a fuse is provided on the primary side of a power source. This type of device, however, has the difficulty that, when the abnormality is of such a degree that an abnormal current does not flow on the primary side of the power source, the fuse is not cut off and the abnormal state continues with resulting damage to circuit elements.

It is, therefore, an object of the invention to eliminate the above described drawbacks of the prior art technique and provide a protection circuit for an audio amplifier capable of accurately protecting circuit elements and loudspeakers by cutting off a primary side of a power source against occurrence of an abnormal current in an output stage of a power amplifier and occurrence of dc voltage in an output signal line of a power amplifier.

SUMMARY OF THE INVENTION

According to the invention, a power relay is provided on a primary side of a power source of an audio amplifier. When a power switch has instructed power-on, a drive power is supplied from an auxiliary power source to the power relay by an instruction given by a control section which is supplied with an operating power thereby to turn on the power relay. A primary voltage is thereby supplied to the power source to set the audio amplifier to a power-on state. When the audio amplifier is in the power-on state, an excess current flowing in an output stage of a power amplifier and dc voltage occurring in an output signal line of the power amplifier and, if necessary, an abnormal voltage occurring in the power source are detected and the power relay is cut off by an instruction from the control section when either one of the abnormalities takes place whereby a primary side of the power source is accurately cut off when abnormality has occurred. According to the invention, since the primary side of the power source is accurately cut off when abnormality has occurred, damage to circuit elements and loudspeakers can be prevented even when abnormality has occurred in the power source.

In one aspect of the invention, a power relay is provided on a primary side of a power source of an audio amplifier and a loudspeaker relay is provided on an output signal line between an output of a power amplifier and a terminal of a loudspeaker. When the power switch has been turned on, the power relay is turned on and presence or absence of an excessive current in an output stage of a power amplifier and presence or absence of dc voltage in an output signal line of of the power amplifier are detected. When no abnormality is detected, the loudspeaker relay is turned on to enable the audio device to playback an audio signal and when any abnormality has subsequently been detected, the loudspeaker relay is turned off to thereby turn off the power relay. According to this aspect of the invention, damage to the loudspeaker and circuit elements in case of occurrence of abnormality can be prevented.

In another aspect of the invention, when the power switch has been turned on and the power relay is thereby turned on, presence or absence of an excess current is first detected and presence or absence of dc voltage is detected only after an output of the power relay is stabilized. When an excess current has been detected before starting of detection of dc voltage, the power relay is turned off without performing detection of presence or absence of dc voltage whereby damage to circuit elements due to an excess current can be accurately prevented and, besides, misdetection of a state before stabilizing of dc potential of the output of the power amplifier erroneously for occurrence of dc voltage can be prevented.

In still another aspect of the invention, after turning off of the loudspeaker relay upon detection of any abnormality, presence or absence of abnormality is detected again and, when no abnormality is detected, the power relay is kept in the on-state. By this arrangement, damage to circuit elements can be accurately prevented and, besides, turning off of the power relay even when it is unnecessary to turn it off can be prevented whereby an adverse effect to performance of other functions of the audio device such as recording of another source by a selector of the audio device can be prevented.

Preferred embodiments of the invention will be described below with reference to the accompanying drawings.

BRIEF DESCRIPTION OF THE DRAWINGS

In the accompanying drawings.

DESCRIPTION OF PREFERRED EMBODIMENTS

Figure 1:
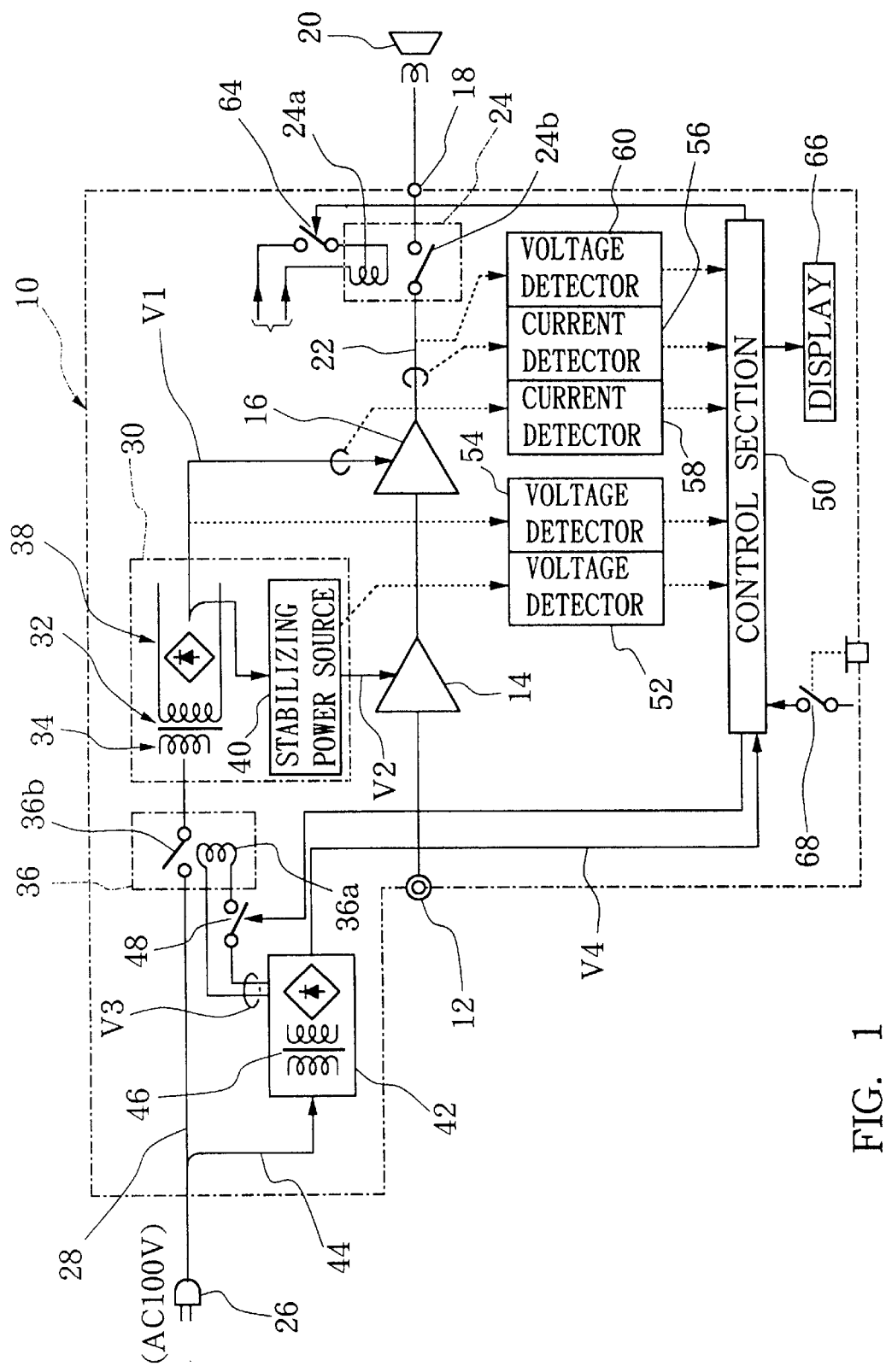
FIG. 1 is a block diagram showing a preferred embodiment of the invention.

FIG. 1 shows an embodiment of the invention. In an audio pre-main amplifier 10, an audio signal applied from an input terminal 12 is subjected to signal processing including voltage amplifying and frequency character adjustment by a pre-amplifier 14 and then is power-amplified by a power amplifier 16. The audio signal is then outputted from a loudspeaker output terminal 18 and supplied to a loudspeaker 20. A loudspeaker relay 24 is provided on an output signal line 22 between the output of the power amplifier 16 and the loudspeaker output terminal 18.

A commercial ac source voltage is applied from a plug socket 26 and supplied to a primary side 34 of a power transformer 32 of a power source 30 through a power line 28. A power relay 36 is provided on the power line 28. Voltage on a secondary side 38 of the power transformer 32 is rectified and smoothed to form a power amplifier dc voltage V1 and this voltage V1 is supplied to the power amplifier 16. In the power source 30, the dc voltage V1 is applied to a stabilizing power source 40 (including a three-terminal regulator and a DC-DC converter) to form a pre-amplifier dc source voltage V2 and this voltage V2 is supplied to the preamplifier amplifier 14. Instead of forming the pre-amplifier dc source voltage V2 by the stabilizing power source 40, this voltage V2 may be formed by rectifying and smoothing voltage provided from another tap of the secondary side 38 of the power transformer 32.

An auxiliary power source 42 is connected to the power line 28 at a point before the power relay 36 by means of an auxiliary power line 44. In the auxiliary power source 42, the commercial ac source voltage is supplied through the auxiliary power line 44 to a primary side of an auxiliary power transformer 46 and voltage on a secondary side of the auxiliary power transformer 46 is rectified and smoothed to form a power relay operating dc source voltage V3 and a control section operating dc source voltage V4. The power relay operating dc source voltage V3 is supplied through a switch 48 to a relay coil 36a of the power relay 36. The control section operating dc source voltage V4 is supplied as an operating power to a control section 50.

A voltage detector 52 detects abnormality of the output voltage V2 of the stabilizing power source 40. A voltage detector 54 detects abnormality of the output voltage V1 of the power source 30. A current detector 58 which constitutes the excess current detection circuit detects an excess current flowing in an output stage of the power amplifier 16. In this embodiment, there is also provided a current detector 56 which detects an excess current flowing in the output signal line 22 of the power amplifier 16. This current detector 56 constitutes also the excess current detection circuit because it detects indirectly an excess current flowing in the output stage of the power amplifier 16. A voltage detector 60 which constitutes the dc voltage detection circuit detects occurrence of dc voltage (dc potential) above a predetermined level on the output signal line 22 of the power amplifier 16. The location where abnormality should be detected and the detector for detecting such abnormality may be increased, if necessary.

A power switch 68 is an operation switch for turning on and off the power for the pre-main amplifier 10 and is provided on a front panel of the pre-main amplifier (or on an operation panel of a remote controller). The contact of the power switch 68 is closed while a listener continues to press the power switch 68 with his finger and is opened when he releases his finger from the power switch 68.

The control section 50 including a microcomputer receives abnormality detection outputs of the detectors 52, 54, 56, 58 and 60 and an operation output of the power switch 68 and performs an on-off control of the switch 48 which switches conduction and non-conduction of the relay coil 36a of the power relay 36 and a switch 64 which switches conduction and non-conduction of the relay coil 24a of the loudspeaker relay 24.

When the relay coil 36a is brought into conduction, the power relay 36 is turned on and, when conduction of the relay coil 36a is cut off, the power relay 36 is turned off. When the relay coil 24a of the loudspeaker relay 24 is brought into conduction, the loudspeaker relay 24 is turned on and, when conduction of the relay coil 24a is cut off, the loudspeaker 24 is turned off. The power for supplying an electric current to the relay coil 24a of the loudspeaker relay 24 may be supplied from either the power source 30 or the auxiliary power source 42. When the control section 50 has detected abnormality, it memorizes contents of the abnormality and indicates it on a display 66. A power for driving the display 66 is supplied from the auxiliary power source 42.

The control operation by the control section 50 will now be described. When the power switch 68 is depressed in a power-off state, the switch 48 is turned on and the relay coil 36a of the power relay 36 is brought into conduction by the operating voltage V3 supplied from the auxiliary power source 42. The relay contact 36b is thereby closed and the commercial ac source voltage (AC100V) is supplied to the power source 30. The driving source voltages V2 and V1 are thereby supplied from the power source 30 to the pre-amplifier 14 and the power amplifier 16.

Simultaneously with starting of the operation of the pre-amplifier 14 and the power amplifier 16, the detectors 52, 54, 56, 58 and 60 start detection of abnormality in the respective portion of the circuit. When no abnormality is detected, the control section 50 turns on the switch 64 thereby to bring the relay coil 24a of the loudspeaker relay 24 into conduction. The relay contact 24b is thereby closed to cause the audio signal applied from the input terminal 12 to be provided from the loudspeaker output terminal 18 through the pre-amplifier 14 and the power amplifier 16 and reproduced by the loudspeaker 20.

When some abnormality has been detected before turning on of the loudspeaker relay 24, the power relay 36 is immediately turned off without turning on of the loudspeaker relay 24. When some abnormality has been detected after turning on of the loudspeaker relay 24, both the loudspeaker relay 24 and the power relay 36 are turned off.

In the case where some abnormality has been detected after turning on of the loudspeaker relay 24, turning on and off of the loudspeaker relay 24 and the power relay 36 may be differed depending upon the type of the abnormality. When, for example, abnormality has been detected by the voltage detectors 52 and 54, the abnormality is deemed to have occurred in the power source 30 or in the load and the power relay 36 is turned off (the loudspeaker relay 24 is also turned off simultaneously). By this arrangement, there is hardly possibility of fuming and the audio amplifier can be protected safely. In the case of detection of abnormality by the other detectors, a similar treatment including turning off of the power relay 36 may be performed. However, in the case of detection of dc voltage by the detector 60 on the output signal line 22 of the power amplifier 16, for example, there is possibility of an erroneous detection due to an excess input. For coping with such situation, a control may be made so that, when such detection has been made, the loudspeaker relay 24 is first turned off and, if the abnormality has not ceased within a predetermined length of time (e.g.,. several seconds), the power relay 36 is then turned off on the assumption that the abnormality has occurred in the circuit.

When an abnormal current (excess current) has been detected by the current detector 56 for the output signal line 22 of the power amplifier 16, the loudspeaker relay 24 is turned off and then the current value in the output stage of the power amplifier 16 is judged by the current detector 58. If the current value is not abnormal (excessive), it is assumed that the abnormality has occurred due to short-circuiting in a stage including the loudspeaker output terminal 18 or after and a warning to this effect is made on the display 66 while the power relay 36 is maintained in the on state. If abnormality has been detected by the current detector 58 after turning off of the loudspeaker relay 24, it is assumed to be abnormality in the circuit and the power relay 36 is turned off.

In FIG. 1, the loudspeaker relay 24 is provided on the output of the power amplifier 16. However, the loudspeaker 20 and the circuit elements can be protected safely by turning off the power relay 36, if a detector of an abnormal state is provided instead of the loudspeaker relay 24. Also, by setting the program of the control section 50 so that contents of abnormality are stored in a memory provided in the control section 50 or other unit when such abnormality has occurred, this storage is held by a backup of the auxiliary power source 42 even after compulsory turning off of the power relay 36, and the stored contents are displayed on the display 66 when the power switch 68 is turned on again, the location of abnormality can be notified to a service man. A secondary cell such as a nickel-cadmium battery or lithium ion battery or a backup capacitor may be incorporated in the auxiliary power source 42 and such secondary cell or backup capacitor may be charged when the plug socket 26 is connected to the commercial ac source voltage. By this arrangement, the memory can be backed up by the secondary cell or backup capacitor even after the plug socket 26 is disconnected from the commercial source voltage.

EXAMPLE 1

Figure 2:
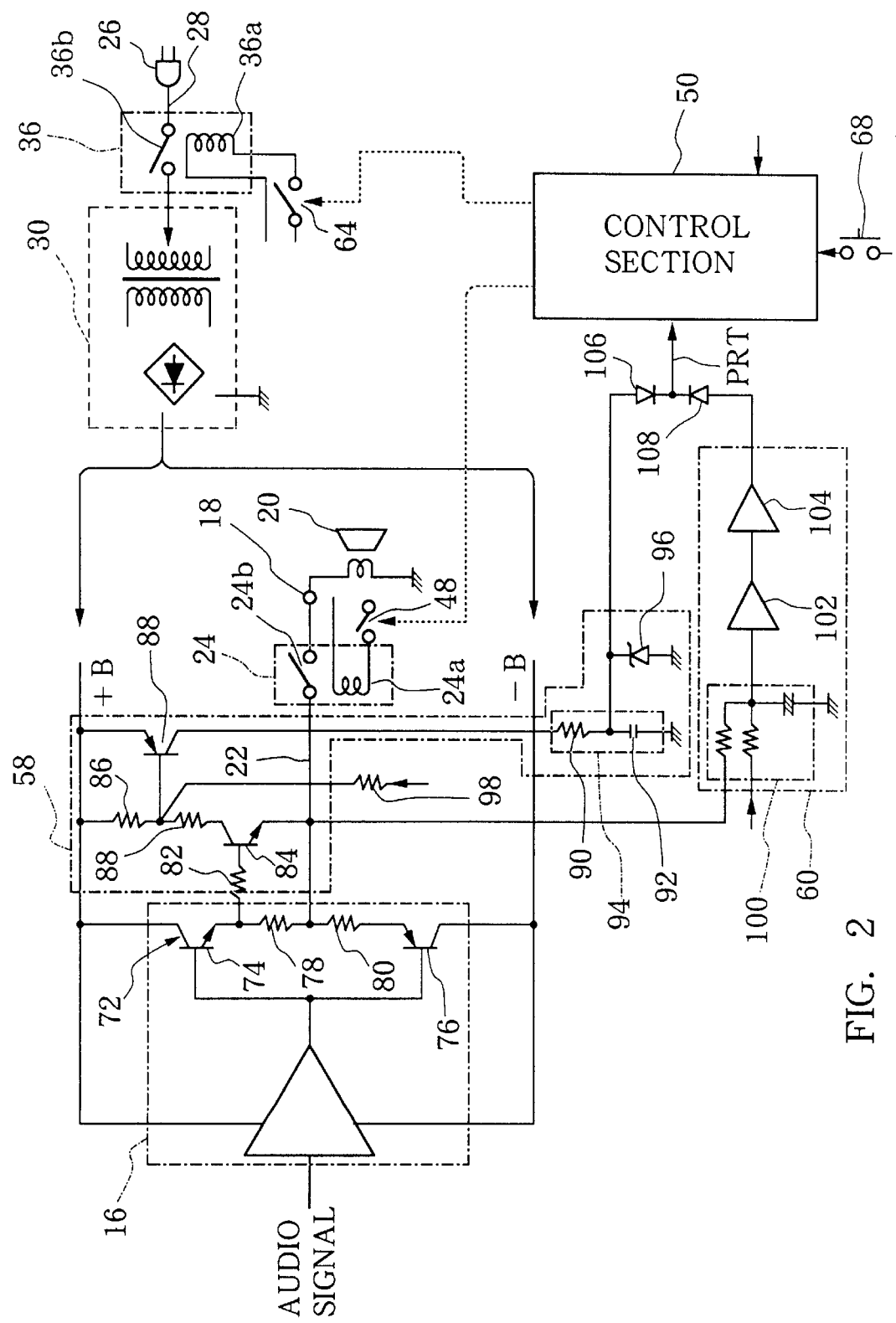
FIG. 2 is circuit diagram showing a specific example of the audio amplifier of FIG. 1.

A specific example of the audio amplifier of FIG. 1 is shown in FIG. 2 (only one of left and right channels is shown). In this example, the power relay 36 and the loudspeaker relay 24 are controlled in accordance with the current detector 58 (excess current detection circuit) and the voltage detector 60 (dc voltage detection circuit). In an output stage 72 of the power amplifier 16, push-pull transistors 74 and 76 are connected between power source voltages +B and –B. An audio signal is applied from a former stage to the bases of the transistors 74 and 76 and outputs of the transistors 74 and 76 are supplied to the loudspeaker 20 through a junction of resistors 78 and 80 which are connected in series between the emitters of these transistors 74 and 76 and the loudspeaker relay 24 provided on the output signal line 22.

The current detector 58 detects an excess current flowing in the output stage of the power amplifier 16. In the current detector 58, a series circuit of a resistor 82 and base and emitter of a transistor 84 is connected between terminals of a resistor 78 and a junction of resistors 86 and 88 connected between the collector of the transistor 84 and the +B power line is connected to the base of a transistor 88. The collector of the transistor 88 is grounded through a resistor 90 and a capacitor 92 which constitute a noise removing filter 94 and voltage of the capacitor 92 is taken out by a Zener diode 96 which constitutes a limiter. The noise removing filter 94 is provided for preventing an erroneous detection of a temporary excess output for an excess current state. The Zener diode 96 is provided for determining the upper limit of the output of the noise removing filter 94 at 5 V (i.e., "H" level).

According to this arrangement, as the current in the output stage 72 exceeds a predetermined value, voltage across the resistor 78 increases and the transistor 84 is thereby turned on. This causes the transistor 88 to be turned on and the output of the noise removing filter 94 becomes "H" level whereby an excess current state is detected. In the other channel, a resistor and a transistor corresponding to the resistor 82 and the transistor 84 are also provided and the collector of the transistor corresponding to the transistor 84 is connected to the base of the transistor 88. By this arrangement, when an excess current flows in the output stage of even one of the left and right channels, the transistor 88 is turned on and the output of the noise removing filter 94 becomes "H" level.

The voltage detector 60 detects dc voltage in the output signal line 22 of the power amplifier 16. More specifically, the voltage detector 60 removes an ac component from the output of the power amplifier 16 through an ac component removing filter 100 and rectifies the output of the ac component removing filter 100 by a full wave rectifying circuit 102. The full wave rectifying is performed for enabling detection of dc voltage regardless whether the dc voltage is positive or negative. The output of the full wave rectifying circuit 102 is applied to a comparator 104 and, when the output exceeds a predetermined abnormality detection level set in the comparator 104, the comparator 104 produces a signal of "H" level. The outputs of the current detector 58 and voltage detector 60 are combined together through diodes 106 and 108 and a logical sum thereof is applied as a signal PRT to the control section 50.

Figure 3:
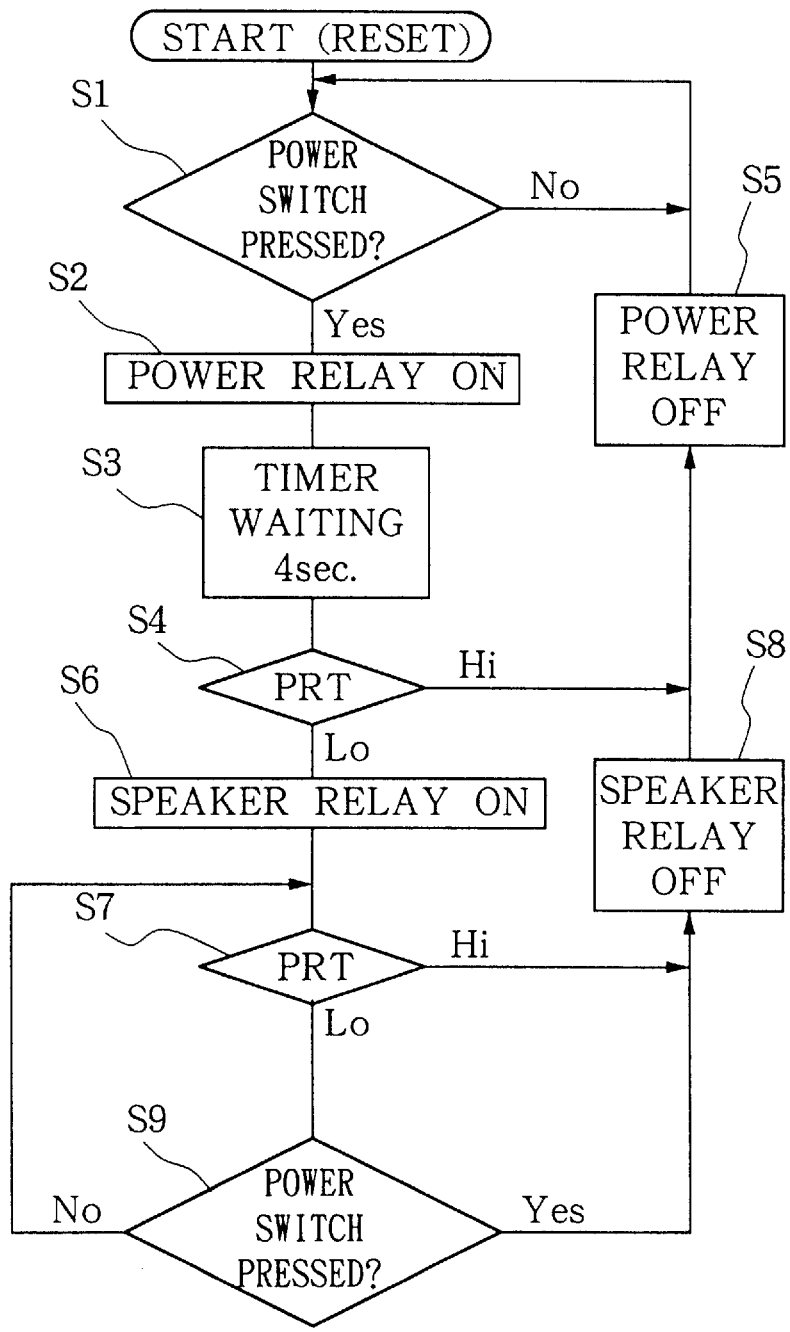
FIG. 3 is a flow chart showing an operation of the control section of FIG. 2.

The operation of the control section 50 is shown in FIG. 3. Upon depression (turning on) of the power switch 68 from the power-off state (S1), the power relay 36 is turned on (S2). Upon lapse of 4 seconds, for example, as time length necessary for stabilizing of dc voltage of the output of the power amplifier 16 (S3), the level of the signal PRT is detected (S4). When the signal PRT is at the "H" level, it is judged to be an abnormal state and the power relay 36 is turned off (S5). When the signal PRT is at the "L" level, it is judged to be a normal state and the loudspeaker relay 24 is turned on (S6). When the signal PRT thereafter is turned to the "H" level (S7), the loudspeaker relay 24 is turned off (S8) and the power relay 36 is also turned off (S5). When the power switch 68 is depressed (turned off) from the power-on state (S9), the loudspeaker relay 24 is turned off (S8) and the power relay 36 is also turned off.

EXAMPLE 2

Figure 4:
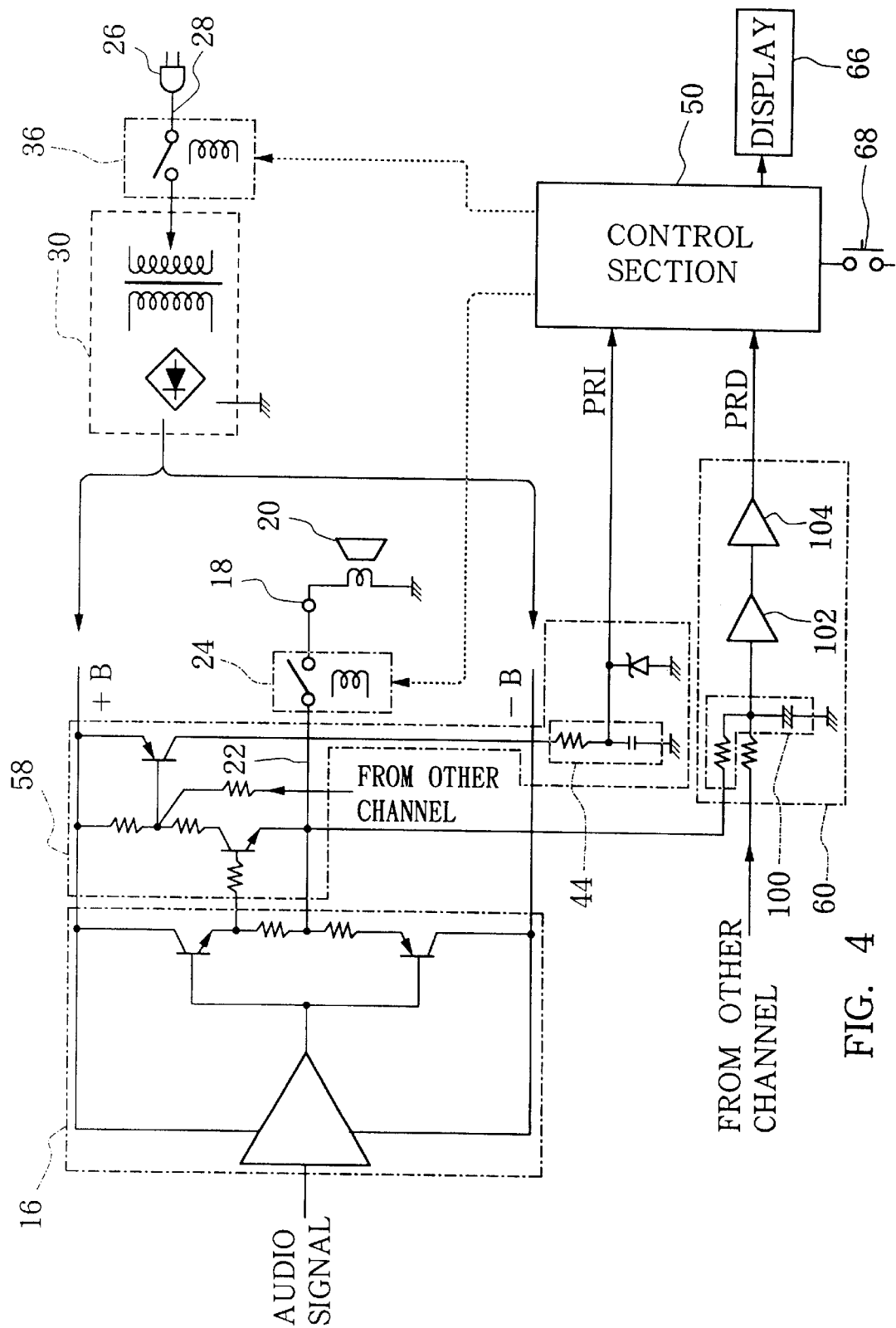
FIG. 4 is a circuit diagram showing another specific example of the audio amplifier of FIG. 1.

Another specific example of the audio amplifier of FIG. 1 is shown in FIG. 4. In this example, a logical sum of the output of the current detector 58 and the output of the voltage detector 60 is not applied to the control section but these outputs are applied to the control section 50 respectively as signals PRIG and PD.

Figure 5:
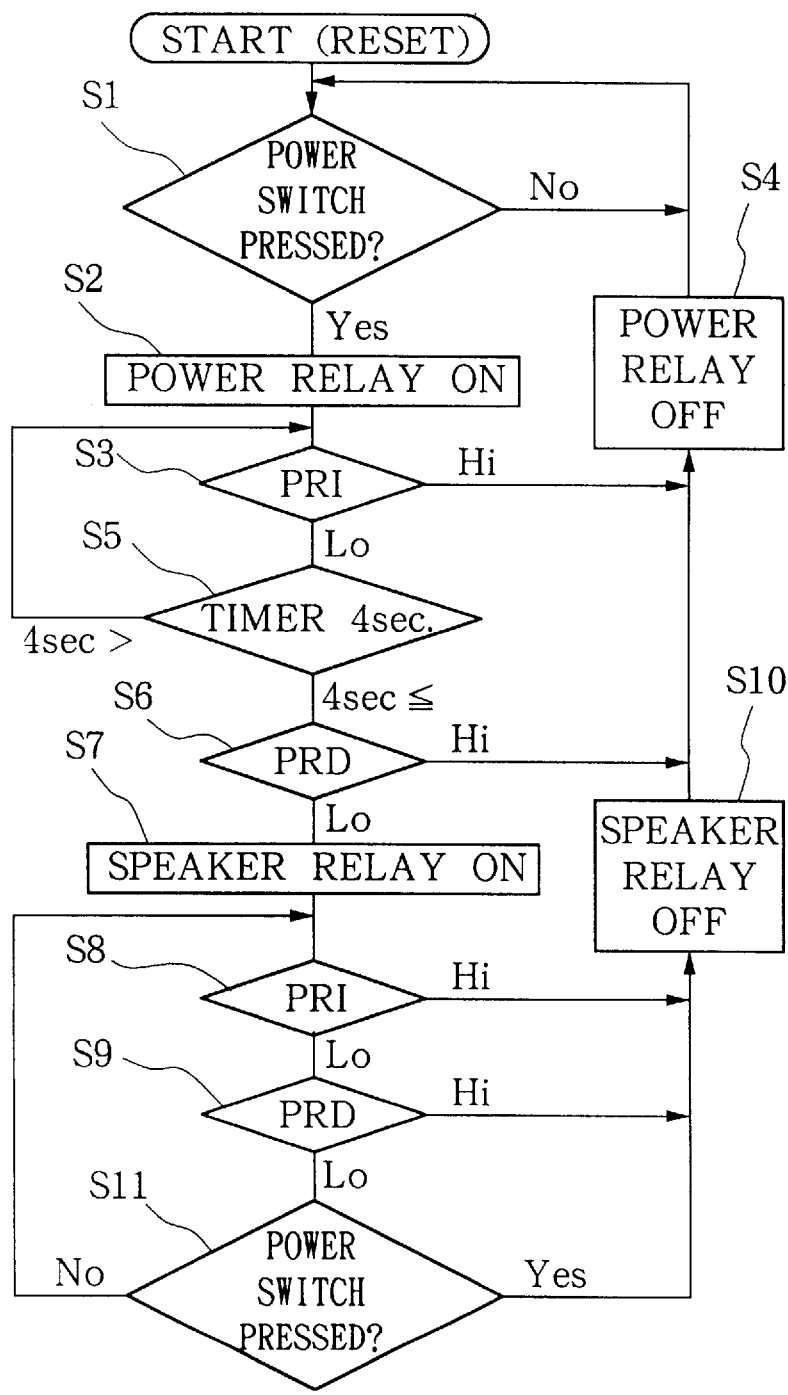
FIG. 5 is a flow chart showing an operation of the control section of FIG. 4.

The operation of the control section 50 of this example is shown in FIG. 5. Upon depression (turning on) of the power switch 68 from the power-off state (S1), the power relay 36 is turned on (S2). Immediately thereafter, presence or absence of an excess current is detected by the signal PR1 (S3). When an excess current has been detected, the power relay 36 is immediately turned off. When no excess current has been detected, upon lapse of time length required for stabilizing of dc potential of the output of the power amplifier 16 (e.g.,. 4 seconds after turning on of the power relay 36)(S5), presence or absence of dc voltage in the output signal line 22 of the power amplifier 16 is detected (S6). When dc voltage has been detected, the power relay 36 is turned off (S4) whereas when no dc voltage has been detected, the loudspeaker relay 24 is turned on (S7). The waiting time in the step S5 may be shortened (e.g., to 2 seconds) and a waiting time (e.g., 2 seconds) may be inserted immediately after the step S6 so that the power relay 36 is turned off immediately when dc voltage has occurred.

After turning on of the loudspeaker relay 24, presence or absence of an excess current and dc voltage is repeatedly detected by the signals PR1 and PRD. (S8, S9). When abnormality has occurred, the loudspeaker relay 24 is turned off (S10) and the power relay 36 is also turned off (S4). Upon depression (turning off) of the power switch 68 from the power-on state (S11), the loudspeaker relay 24 is turned off (S10) and the power relay 36 is also turned off (S4).

If an excess current flows immediately after turning on of the power relay 36 in a circuit where there is only one abnormality detection signal (PRT) as in Example 1, the power relay 36 cannot be turned off (S5) until a predetermined waiting time (e.g., 4 seconds) has elapsed (S3) for waiting for stabilizing of dc voltage of the output of the power amplifier 16 and an abnormal state such as fuming may proceed during this waiting time. In contrast thereto, according to Example 2, since the excess current detection signal PR1 and the dc voltage detection signal PRD are applied separately to the control section 50, the power relay 36 can be turned off immediately (the route from S3 to S4 in FIG. 5) in case an excess current flows immediately after turning on of the power relay 36 whereby progress of an abnormal state can be prevented.

Figure 6:
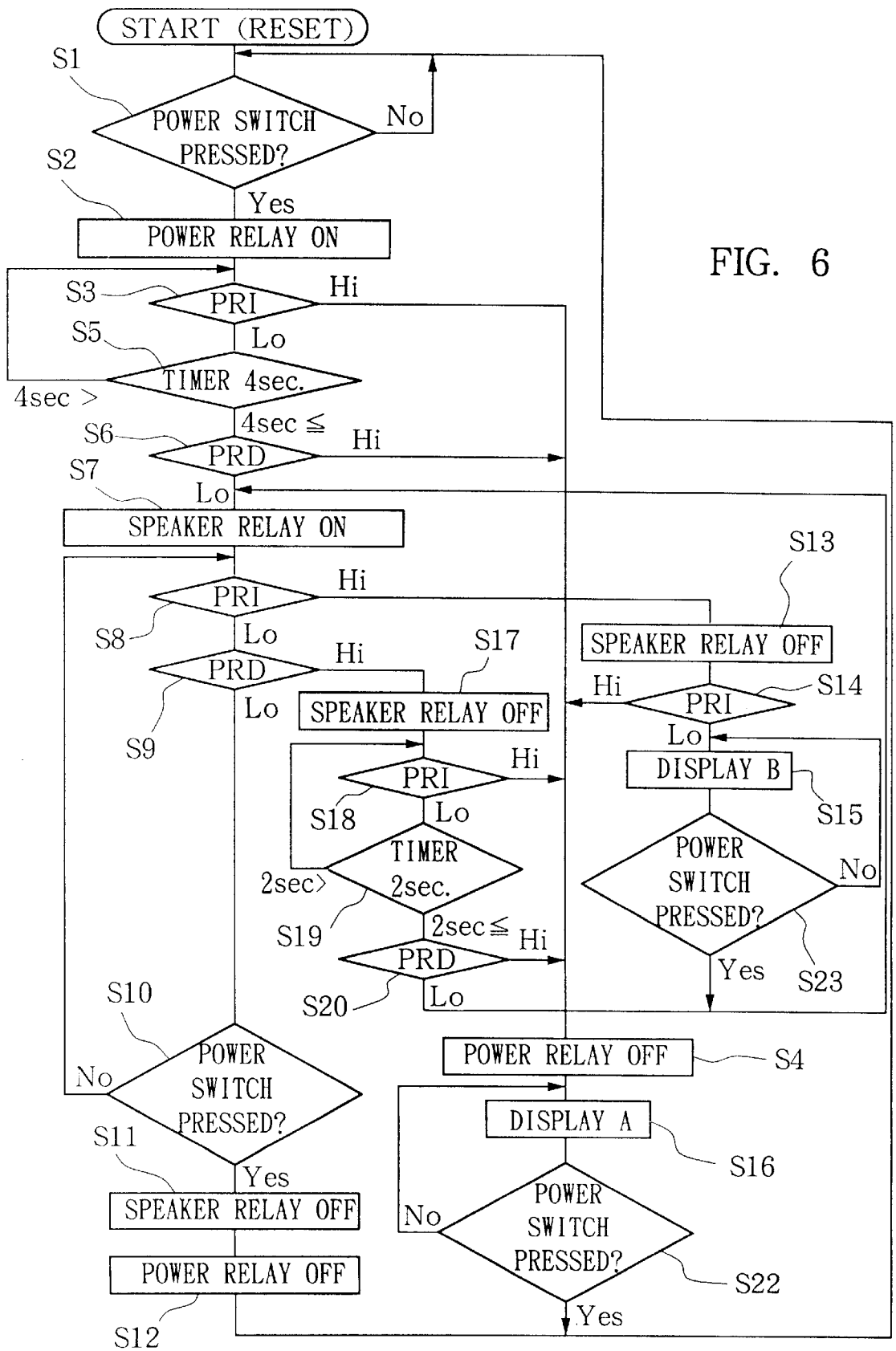
FIG. 6 is a flow chart showing another example of the operation of the control section of FIG. 4.

Another example of the operation of the control section 50 is shown in FIG. 6. Upon depression (turning on) of the power switch 68 from the power-off state (S1), the power relay 36 is turned on (S2) and immediately thereafter, presence or absence of an excess current is detected by the signal PR1 (S3). When an excess current has been detected, the power relay 36 is immediately turned off (S4). When no excess current has been detected, presence or absence of dc voltage in the output signal line of the power amplifier 16 is detected (S6) upon lapse of time length required for stabilizing of dc potential of the output of the power amplifier 16 (e.g., 4 seconds after turning on of the power relay 36) (S5). When dc voltage has been detected, the power relay 36 is turned off (S4) whereas when no dc voltage has been detected, the loudspeaker relay 24 is turned on (S7). The waiting time in the step S7 may be shortened (e.g., to 2 seconds) and a waiting time (e.g,. 2 seconds) may be inserted immediately after the step S6 so that the power relay 36 can be turned off immediately in case abnormality has occurred in dc voltage.

After turning on of the loudspeaker relay 24, presence or absence of an excess current and dc voltage is repeatedly detected by the signals PR1 and PRD (S8, S9). Upon depression (turning off) of the power switch 68 from the power-on state (S10), the loudspeaker relay 24 is turned off (S11) and the power relay 36 is also turned off (S12).

When an excess current flows in the on-state of the loudspeaker relay 24 (S8), the loudspeaker relay 24 is turned off (S13), and presence or absence of an excess current is detected again (S14). When an excess current has ceased to flow, it is assumed that the abnormality has occurred due to an external cause such as short-circuiting circuiting of the loudspeaker output terminal 18 and display B indicating an external cause is made on the display 66 (S15). Upon depressing the power switch 68 in this state (corresponding to a reset operation) (S23), the loudspeaker relay 24 is turned on (S7) to restore to the initial state. Conversely, when the excess current has not ceased to flow, it is assumed that the abnormality has occurred due to malfunction of the audio device and, in this case, the power relay 36 is turned off (S4) and a display A indicating "abnormality in the device" is made on the display 66 (S16).

When dc voltage has been detected in the on-state of the loudspeaker relay 24 (S9), the loudspeaker relay 24 is turned off (S17) and presence or absence of an excess current is detected (S18). When an excess current has been detected, it is assumed that the abnormality has occurred in the audio device and the power relay 36 is turned off (S4) and the display A indicating abnormality in the device is made on the display 66 (S16). When no excess current has been detected, presence or absence of dc voltage is detected (S20) upon lapse of a predetermined waiting time (e.g., 2 to several seconds)(S19). When dc voltage has ceased to occur, it is assumed that the abnormality has occurred due to an external cause such as an abnormal (excessive) input and, in this case, the loudspeaker relay 24 is turned off (S7) to restore to the initial state. Conversely, when dc voltage has not ceased to occur, it is assumed that the abnormality has occurred in the audio device and, in this case, the power relay 36 is turned off (S4) and the display A indicating abnormality in the device is made on the display 66 (S16). If the power switch 68 is depressed once when the display A is made (S22), the circuit is reset to the initial state.

According to the control of FIG. 6, since the power relay 36 is not turned off when abnormality has been detected due to an external cause, performance of other functions by the audio device such as recording of another source by a selector is not affected by detection of such abnormality.

EXAMPLE 3

Figure 7:
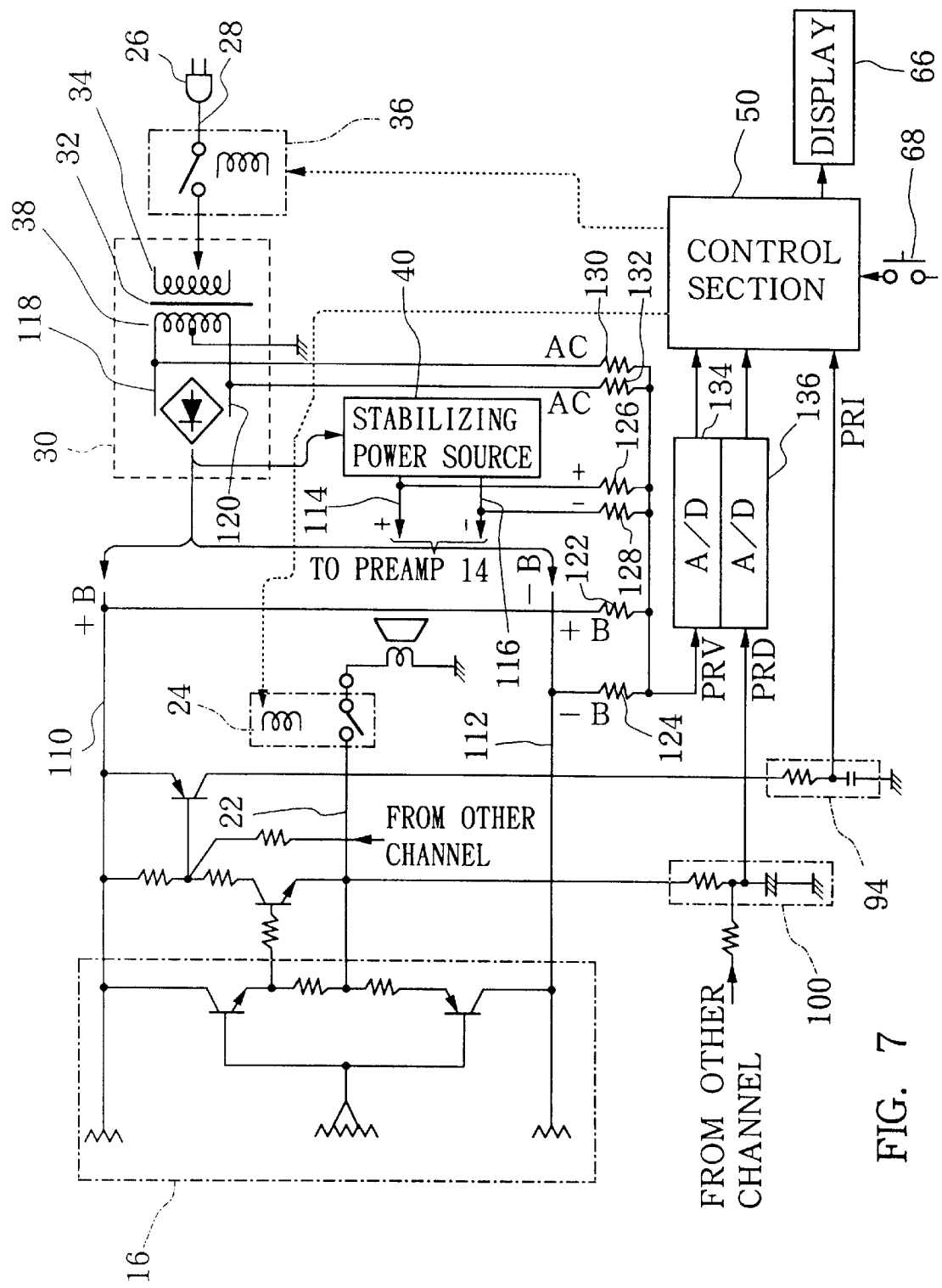
FIG. 7 is a circuit diagram showing another example of the audio amplifier of FIG. 1.

Another specific example of the audio amplifier of FIG. 1 is shown in FIG. 7. In this example, in addition to the circuit of FIG. 4, abnormality in the source voltages +B and −B of the power amplifier 16 and abnormality in voltage of the stabilizing power source 40 are detected and, further, abnormality such as cutting of a coil used in the power transformer 32 is detected by watching of ac voltage on the secondary side 38 of the power transformer 32 so as to turn off the loudspeaker relay 24 and the power relay 36. More specifically, voltages of power lines 110 and 112 of the power amplifier 16, output power lines 114 and 116 of the stabilizing power source 40, ac power lines 118 and 120 on the secondary side 38 of the power transformer 32 in the power source 30 are combined together through resistors 122, 124, 126, 128, 130 and 132 to form a signal PRV. This signal PRV is 0 volt when the respective source voltages are normal and becomes a positive or negative level when abnormality has occurred in any one of the source voltages.

The signal PRV is converted to a digital signal by an A/D converter 134 and applied to the control section 50. In this example, a detection output of dc voltage in the output signal line 22 of the power amplifier 16 is also converted to a digital signal by an A/D converter 136 and applied to the control section 50. Presence or absence of dc voltage is detected on the basis of a detection level set value set in the control section 50. A noise removing filter 94 and an ac component removing filter 100 may be omitted if functions of these filters are realized by signal processing in the control section 50.

The operation of the control section 50 may be programmed in such a manner that, in the flow chart of FIG. 6, a block of "whether signal PRV is normal (substantially 0 volt) or not" will be inserted before the steps S3 and S8 and after the feed back points from the steps S5 and S10. When the signal PRV is normal, the routine proceeds to next steps S3 and S8 whereas when the signal PRV is not normal, the routine proceeds to the step S4 in which the power relay is turned off.

According to the example of FIG. 7, the circuit can be protected accurately even against abnormality which has occurred in the power source 30. When, for example, where a part of the secondary winding of the power transformer 32 is short-circuited, there occurs a case where the short-circuited current does not amount to a magnitude at which a fuse (not shown) provided on the primay side 34 will be cut off and the amplifier operates normally. In such a case, potentials at the power lines 118 and 120 on the secondary side 38 will differ from each other and abnormality will occur in the signal PRV and, therefore, progress of the abnormality can be prevented by turning off of the power relay 36.

In FIG. 7, the respective source voltages are combined to the signal PRV by means of resistors. Alternatively, the source voltages may be watched individually and which of the source voltages has caused abnormality may be recorded at the time of the protection processing and displayed on the display 66. Such arrangement will be useful when the audio amplifier is checked for repair or maintenance.

As described in the foregoing, according to the invention, circuit elements and loudspeakers can be protected accurately against an excess current flowing in an output stage of a power amplifier and occurrence of dc voltage in an output signal line of a power amplifier and even against abnormality occurring in source voltage.

What is claimed is:

1. A protection circuit for an audio amplifier, the protection circuit comprising:

a power source input terminal to which an ac source voltage is applied;

a power source for converting the ac source voltage applied from the power source input terminal to dc voltages;

a power relay inserted in a power line between the power source input terminal and a primary side of the power source and including a relay coil to turn on the power line when the relay coil is in conduction and turn off the power line when the relay coil is not in conduction;

a power switch which turns on and off of the power source;

a power amplifier for amplifying an audio signal by using a source voltage supplied from the power source for reproduction of the audio signal by a loudspeaker;

a loudspeaker output terminal for providing the audio signal which has been amplified by the power amplifier for reproduction by the loudspeaker;

a loudspeaker relay inserted in a signal line between an output of the power amplifier and the loudspeaker output terminal and including a relay coil for turning on the signal line when the relay coil is in conduction and turning off the signal line when the relay coil is not in conduction;

an excess current detection circuit for detecting an excess current flowing in an output stage of the power amplifier;

a dc voltage detection circuit for detecting dc voltage occurring in an output signal line of the power amplifier;

a control section for receiving an operation output of the power switch, detection outputs of the excess current detection circuit and the dc voltage detection circuit and thereupon controlling supply of an electric current to the relay coil of the power relay and the relay coil of the loudspeaker relay to control turning on and off of the power relay and the loudspeaker relay; and an auxiliary power source for supplying an operating source voltage to the control section when the power relay is off and supplying an operating source voltage used for turning the power relay from the off state to the on state, wherein when turning on of the power switch has been detected by the control section, the relay coil of the power relay is brought into conduction to turn on the power relay and also that the detection states of the excess current detection circuit and the dc voltage detection circuit are judged so that, when either an excess current or dc voltage is detected, conduction of the relay coil of the power relay is cut off to turn off the power relay, and when neither an excess current nor dc voltage is detected, the loudspeaker relay is turned on and, when either the excess current or dc voltage is detected after turning on of the loudspeaker relay, the loudspeaker relay is turned off and the power relay is turned off.

2. A protection circuit for an audio amplifier as defined in claim 1 wherein when the power relay is turned on, the control section first judges presence or absence of the excess current and subsequently judges presence or absence of the dc voltage after an output of the power amplifier has been stabilized and, when the excess current is detected, the control section turns off the power relay without judging presence or absence of the dc voltage.

3. A protection circuit for an audio amplifier as defined in claim 1 wherein said control section performs a control in such a manner that, after the control section has detected either the excess current or dc voltage to turn off the loudspeaker relay after turning on the loudspeaker relay, the control section judges presence or absence of the excess current and dc voltage so that, when is detected, the control section maintains the on state of the power relay whereas, when either the excess current or dc voltage is detected, the control section turns off the power relay.

4. A protection circuit for an audio amplifier as defined in claim 2 wherein said control section performs a control in such a manner that, after the control section has detected either the excess current or dc voltage to turn off the loudspeaker relay after turning on the loudspeaker relay, the control section judges presence or absence of the excess current and dc voltage so that, when neither the excess current nor dc voltage is detected, the control section maintains the on state of the power relay whereas, when either the excess current or dc voltage is detected, the control section turns off the power relay.

5. A protection circuit for an audio amplifier, the protection circuit comprising:

a power relay connected to a power supply to provide power to a voltage converter which produces a converted power;

an amplifier energized by the converted power from the voltage converter, the amplifier amplifying an audio signal;

a speaker relay connected to an output of the amplifier;

a current detector connected to detect at least one of the converted power from the voltage converter and the output of the amplifier;

a voltage detector connected to detect at least one of the converted power from the voltage converter and the output of the amplifier; and a control section responsive to the current detector and the voltage detector to selectively control at least one of the power relay and the speaker relay depending on status of the current detector and the voltage detector.

6. A protection circuit of claim 5, wherein when an abnormal condition is detected by at least one of the current detector and the voltage detector, the control section disables the power relay, and when a normal condition is detected by both the current detector and the voltage detector, the control section enables the speaker relay.

7. A protection circuit of claim 6, wherein when at least one of the current detector and the voltage detector detects the abnormal condition after the enablement of the speaker relay, the control section disables both the power relay and the speaker relay.

8. A protection circuit of claim 5, wherein after the power relay is initially enabled, the control section monitors the current detector and the at the presence of an abnormal condition disables the power relay irrespective of the status of the voltage detector.

9. A protection circuit of claim 8, wherein the control section monitors the voltage detector a predetermined period after monitoring the current detector to enable the speaker relay when a normal condition is detected.

10. A protection circuit of claim 9, wherein after enablement of both the power relay and the speaker relay, the control section disables the speaker relay upon detection of the abnormal condition from at least one of the voltage detector and the current detector.

11. A protection circuit of claim 9, wherein after enablement of both the power relay and the speaker relay, the control section disables the power relay upon detection of the abnormal condition from at least one of the voltage detector and the current detector.

* * * * *